United States Patent
Chen

(10) Patent No.: US 8,213,206 B2
(45) Date of Patent: Jul. 3, 2012

(54) ELECTRONIC APPARATUS

(75) Inventor: Nan-Jang Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 283 days.

(21) Appl. No.: 12/687,984

(22) Filed: Jan. 15, 2010

(65) Prior Publication Data

US 2011/0176345 A1  Jul. 21, 2011

(51) Int. Cl.
G11C 5/02 (2006.01)
G11C 5/06 (2006.01)
H03K 17/16 (2006.01)
H03K 19/094 (2006.01)

(52) U.S. Cl. ............. 365/51; 365/63; 326/30; 326/83
(58) Field of Classification Search ............. 365/51
See application file for complete search history.

(56) References Cited

U.S. PATENT DOCUMENTS

| | | | |
|---|---|---|---|
| 6,308,232 B1 * | 10/2001 | Gasbarro | 710/100 |
| 6,356,106 B1 * | 3/2002 | Greeff et al. | 326/30 |
| 6,661,092 B2 * | 12/2003 | Shibata et al. | 257/724 |
| 6,873,533 B2 * | 3/2005 | Shibata et al. | 365/52 |
| 6,930,904 B2 * | 8/2005 | Wu | 365/72 |
| 6,970,369 B2 * | 11/2005 | Funaba et al. | 365/63 |
| 7,106,610 B2 * | 9/2006 | Fahmy et al. | 365/63 |
| 7,180,327 B2 * | 2/2007 | So et al. | 326/30 |
| 7,245,145 B2 * | 7/2007 | Pax et al. | 326/30 |
| 7,486,105 B2 * | 2/2009 | Li | 326/30 |
| 7,536,494 B2 * | 5/2009 | Garlepp et al. | 710/306 |
| 7,777,517 B2 * | 8/2010 | Hiraishi et al. | 326/30 |
| 2005/0052912 A1 * | 3/2005 | Cogdill et al. | 365/202 |
| 2005/0094425 A1 * | 5/2005 | Cogdill et al. | 365/63 |
| 2010/0020584 A1 * | 1/2010 | Xu | 365/63 |

FOREIGN PATENT DOCUMENTS

CN 1403928 3/2003

OTHER PUBLICATIONS

English language translation of abstract of CN 1403928 (published Mar. 19, 2003).

* cited by examiner

*Primary Examiner* — Son Mai
(74) *Attorney, Agent, or Firm* — Thomas|Kayden

(57) ABSTRACT

An electronic apparatus is provided. A PCB has first and second signal paths therein. First and second fingers are disposed on the first and second signal paths, respectively. A controller is coupled to a first memory via the first finger and a second memory via the second finger, and accesses the first and second memories through the first and second signal paths, respectively. The first and second signal paths share a common segment between the controller and a branch point. First and second components are disposed between the first finger and the branch point and between the second finger and the branch point, respectively. The distances between the first component and the branch point and between the second component and the branch point are smaller than or equal to the distance between the first component and the first finger and between the second component and the second finger, respectively.

20 Claims, 7 Drawing Sheets

ELECTRONIC APPARATUS

BACKGROUND OF THE INVENTION

1. Field of the Invention

The present invention is related to an electronic apparatus, and more particularly to an electronic apparatus comprising a printed circuit board (PCB) with variable quantities of memories therein.

2. Description of the Related Art

As printed circuit board (PCB) technology advances so that electronic apparatuses made therefrom may operate faster and be designed more densely, electromagnetic interference (EMI) problems for electronic apparatuses have increased. For example, in an electronic apparatus, a memory with high data rate may induce reflection effects at signal paths between the memory and a controller thereof when the memory is accessed by the controller. Therefore, I/O pins of a memory with on-die termination (ODT) or damping resistors disposed on the signal paths between the controller and the I/O pins of the memory without ODT are generally used to decrease the reflection effects.

Nowadays, more than one memory is implemented in an electronic apparatus, so as to provide larger data storage areas for complex applications. In order to simplify PCB design and reduce product complexity, a manufacturer may use a common PCB for various electronic apparatuses such as a low-end product with only one memory for providing basic functions or a high-end product with a plurality of memories for providing complex and advanced functions. However, not all of the I/O pins within a memory have ODT design for reducing reflection effects. Thus, parallel or series terminations are used on the signal paths of the I/O pins without ODT on the common PCB. Parallel termination means that a termination device and the signal path of one of the I/O pins without ODT are coupled in parallel on the common PCB. Series termination means that a termination device and the signal path of the one I/O pin without ODT are coupled in series on the common PCB. In general, series termination is the most popular design used due to low cost. However, if only one memory is required in an electronic apparatus with a common PCB that is designed for implementing a plurality of memories, the floating traces on the common PCB that are designed to couple the other memories may cause reflections due to antenna effect.

Therefore, a PCB that is designed to reduce reflections for implementing variable quantities of memories therein is desirable.

BRIEF SUMMARY OF THE INVENTION

Electronic apparatus with a printed circuit board (PCB) for variable quantities of memories are provided. An exemplary embodiment of an electronic apparatus comprises a PCB, a first finger, a second finger, a controller disposed on the PCB and coupled to a first memory via the first finger and to a second memory via the second finger, a first component and a second component. The PCB has a first signal path and a second signal path therein. The first finger is disposed on the first signal path, and the second finger is disposed on the second signal path. The controller accesses the first and second memories through the first and second signal paths, respectively, wherein the first and second signal paths share a common segment between the controller and a branch point on the PCB. The first component is disposed on the first signal path and between the first finger and the branch point, wherein a distance between the first component and the branch point is smaller than or equal to a distance between the first component and the first finger within the first signal path. The second component is disposed on the second signal path and between the second finger and the branch point, wherein a distance between the second component and the branch point is smaller than or equal to a distance between the second component and the second finger within the second signal path.

Moreover, another exemplary embodiment of an electronic apparatus is provided. The electronic apparatus comprises a PCB, the first, second, third and fourth fingers, a controller, the first, second, third, fourth, fifth and sixth components. The PCB has a first signal path, a second signal path, a third signal path and a fourth signal path therein. The first, second, third and fourth fingers are disposed on the first, second, third and fourth signal paths, respectively. The controller is disposed on the PCB and coupled to a first memory via the first finger, a second memory via the second finger, a third memory via the third finger and a fourth memory via the fourth finger. The controller accesses the first, second, third and fourth memories through the first, second, third and fourth signal paths, respectively, wherein the first, second, third and fourth signal paths have a first common segment shared between the controller and a first branch point on the PCB, the first and second signal paths have a second common segment shared between the first branch point and a second branch point on the PCB, and the third and fourth signal paths have a third common segment shared between the first branch point and a third branch point on the PCB. The first component is disposed on the second common segment, wherein a distance between the first component and the first branch point is smaller than or equal to a distance between the first component and the second branch point within the second common segment of the first and second signal paths. The second component is disposed on the third common segment, wherein a distance between the second component and the first branch point is smaller than or equal to a distance between the second component and the third branch point within the third common segment of the third and fourth signal paths. The third component is disposed on a segment of the first signal path between the first finger and the second branch point, wherein a distance between the third component and the second branch point is smaller than or equal to a distance between the third component and the first finger within the first signal path. The fourth component is disposed on a segment of the second signal path between the second finger and the second branch point, wherein a distance between the fourth component and the second branch point is smaller than or equal to a distance between the fourth component and the second finger within the second signal path. The fifth component is disposed on a segment of the third signal path between the third finger and the third branch point, wherein a distance between the fifth component and the third branch point is smaller than or equal to a distance between the fifth component and the third finger within the third signal path. The sixth component is disposed on a segment of the fourth signal path between the fourth finger and the third branch point, wherein a distance between the sixth component and the third branch point is smaller than or equal to a distance between the sixth component and the fourth finger within the fourth signal path.

Furthermore, another exemplary embodiment of an electronic apparatus is provided. The electronic apparatus comprises a PCB, a controller on the PCB, a first memory on the PCB, a first component. The PCB comprises a substrate having a surface, a plurality of fingers on the surface of the substrate, the first, second and third conductive traces on the surface of the substrate. The first conductive trace is disposed between a first finger of the plurality of fingers and a branch via of the substrate. The second conductive trace is disposed between a second finger of the plurality of fingers and the branch via of the substrate. The first, second and third conductive traces are electrically crossed in the branch via of the substrate. The controller has a pin electrically coupled to the first conductive trace of the PCB through the first finger of the PCB. The first memory has a pin electrically coupled to the second conductive trace of the PCB through the second finger of the PCB. The first component divides a second conductive trace into a first sub-trace between the first component and the branch via and a second sub-trace between the first component and the second finger, and the first sub-trace is shorter than or equal to the second sub-trace. A length of the third conductive trace is substantially similar to that of the first sub-trace of the second conductive trace.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
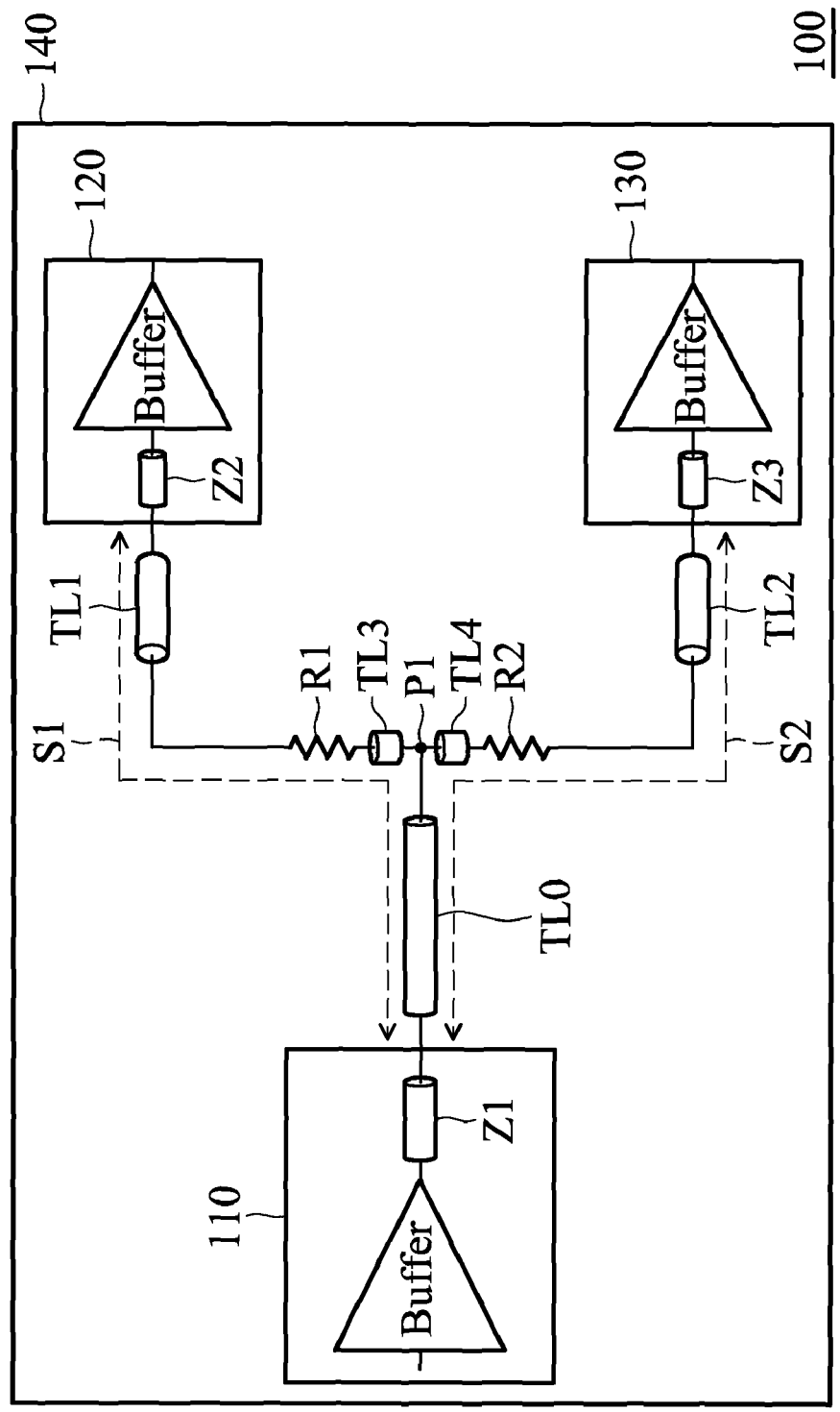
FIG. 1 shows a schematic illustrating an electronic apparatus according to an embodiment of the invention.

FIG. 1 shows a schematic illustrating an electronic apparatus 100 according to an embodiment of the invention, wherein the electronic apparatus 100 has a printed circuit board (PCB) 140 that is able to supply two memories. In the electronic apparatus 100, an I/O block 110 represents one pin of a controller (not shown), which is used to provide a specific signal, such as an address, data, a chip select, and a write enable signal and so on, to a first memory and a second memory (not shown) through the I/O blocks 120 and 130, respectively, wherein the I/O block 120 represents one pin of the first memory corresponding to the specific signal and the I/O block 130 represents one pin of the second memory corresponding to the specific signal. In addition, the inner equivalent impedances of the I/O blocks 110, 120 and 130 are shown as the impedances Z1, Z2 and Z3, respectively. In the embodiment, the controller and the first and second memories are three independent chips disposed on the PCB 140. The I/O block 110 of the controller provides the specific signal to the I/O block 120 of the first memory through a transmission line TL0, a transmission line TL3, a resistor R1 and a transmission line TL1 which form a signal path S1. Simultaneously, the I/O block 110 of the controller provides the specific signal to the I/O block 130 of the second memory through the transmission line TL0, a transmission line TL4, a resistor R2 and a transmission line TL2 which form a signal path S2. Therefore, the signals carried in the signal paths S1 and S2 are identical, i.e. the specific signal. Specifically, the controller accesses the first and second memories through the signal paths S1 and S2, respectively. In addition, the signal paths S1 and S2 have a common segment shared between the I/O block 110 and a branch point P1 on the PCB 140, i.e. the transmission line TL0.

As shown in FIG. 1, the resistor R1 is disposed between the I/O block 120 and the branch point P1 and near to the branch point P1, i.e. the transmission line TL3 is shorter than or equal to the transmission line TL1 within the signal path S1. Similarly, the resistor R2 is disposed between the I/O block 130 and the branch point P1 and near to the branch point P1, i.e. the transmission line TL4 is shorter than or equal to the transmission line TL2 within the signal path S2. If the I/O blocks 120 and 130 represent the pins of the first and second memories without on-die termination (ODT), such as all pins of a double data rate (DDR) SDRAM, address/command/control pins of a DDR2 and DDR3 SDRAM and so on, each of the resistors R1 and R2 is a damping resistor with resistance larger than or equal to a specific resistance value, such as $R1 \geq 10$ ohm and $R2 \geq 10$ ohm. On the contrary, if the I/O blocks 120 and 130 represent the pins of the first and second memories with ODT, such as data/address pins of a GDDR3 SGRAM etc., each of the resistors R1 and R2 is a connecting resistor with resistance smaller than or equal to a specific resistance value, such as $R1 \leq 10$ ohm and $R2 \leq 10$ ohm. In FIG. 1, in order to obtain impedance matching between the signal paths S1 and S2, the resistance of the resistors R1 and R2 are the same. Further, with adjusting the driving strength of the controller, there is no special requirement for the resistance of the resistors R1 and R2. For example, when implementing the resistors R1 and R2 as damping resistors, there is no preference for resistances of the resistors R1 and R2 where resistors with resistances of 0 ohm, can be used for the damping resistors R1 and R2 with properly adjusting the driving strength of the controller. Similarly, when implementing the resistors R1 and R2 as connecting resistors, there is no preference for resistances of the resistors R1 and R2 where resistors with larger resistances, such as 47 ohm, can be used for the connecting resistors R1 and R2 with properly adjusting the driving strength of the controller.

Figure 2:
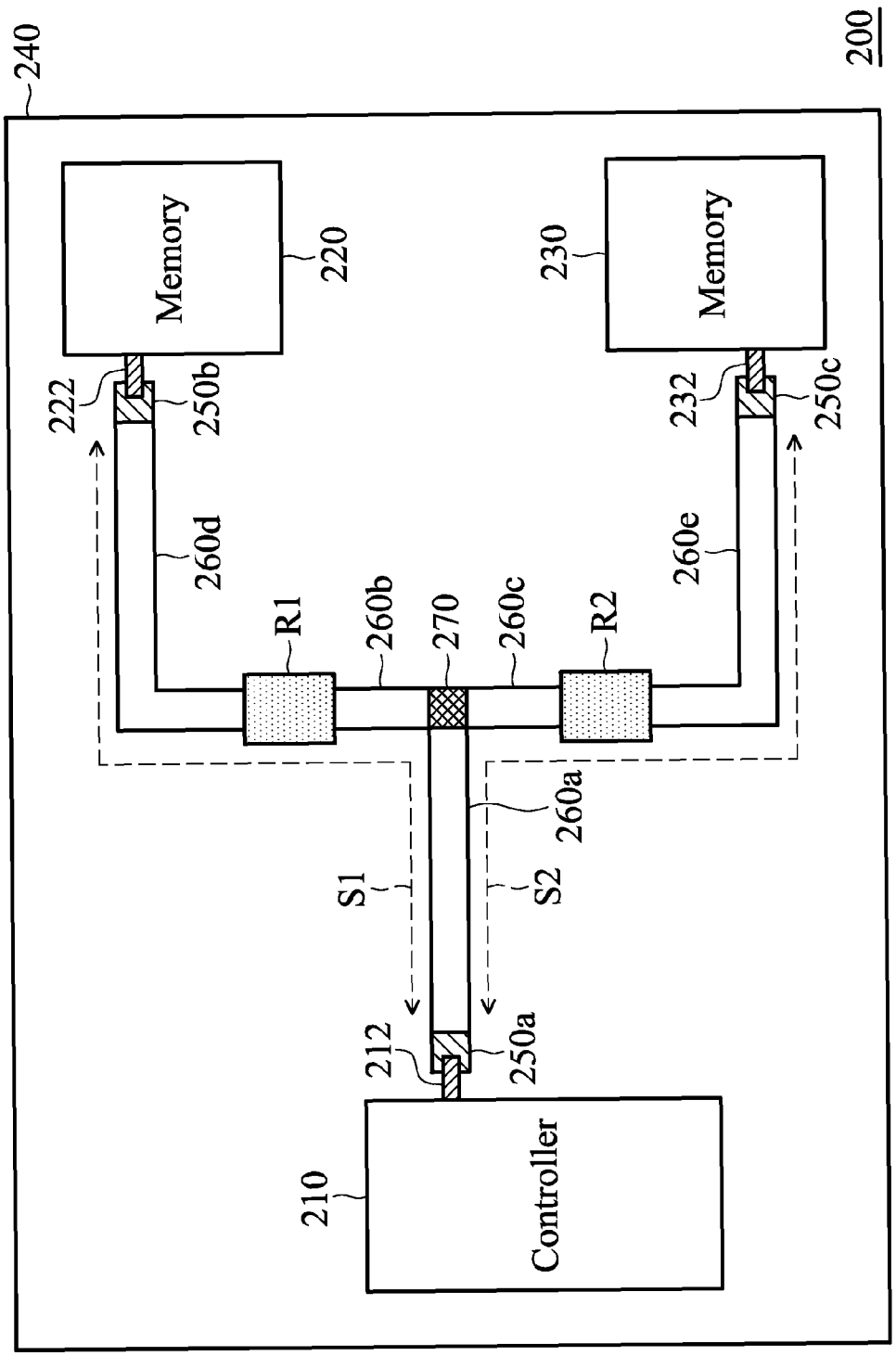
FIG. 2 shows a top view illustrating a PCB within an electronic apparatus according to an embodiment of the invention.

FIG. 2 shows a top view illustrating a PCB 240 within an electronic apparatus 200 according to an embodiment of the invention, wherein two memories 220 and 230 are implemented in the electronic apparatus 200. The PCB 240 comprises a substrate having a surface (not shown). In the embodiment, the fingers 250a-250c, the traces 260a-260e and a branch point 270 are disposed on surface of the substrate of the PCB 240. A pin 212 of a controller 210 is soldered to the finger 250a of the PCB 240, a pin 222 of the memory 220 is soldered to the finger 250b of the PCB 240, and a pin 232 of the memory 230 is soldered to the finger 250c of the PCB 240. In addition, two resistors R1 and R2 are also soldered to the PCB 240 for the memories 220 and 230. In the embodiment, only one signal transmitted between the controller 210 and the memories 220 and 230 is illustrated in order to simplify description. Furthermore, the controller 210 and the memories 220 and 230 may be packaged in any type of package, such as a quad flat package (QFP), a ball grid array (BGA) and so on. As described above, the controller 210 accesses the memory 220 through a signal path S1 comprising the trace 260a, the branch point 270, the trace 260b, the resistor R1 and the trace 260d, and the controller 210 accesses the memory 230 through a signal path S2 comprising the trace 260a, the branch point 270, the trace 260c, the resistor R2 and the trace 260e. The traces 260a, 260b and 260c are electrically crossed in the branch point 270 of the PCB 240. In one embodiment, the branch point 270 may be a via/hole of the PCB 240 when the traces 260a, 260b and 260c are disposed on different layers within the substrate of PCB 240.

As shown in FIG. 2, the trace 260a is a common segment of the signal paths S1 and S2, and the resistors R1 and R2 are disposed in another segment of the signal path S1 or S2 respectively other than the common segment. The trace 260b is shorter than or equal to the trace 260d within the signal path S1 for the resistor R1, and trace 260c is shorter than or equal to the trace 260e within the signal path S2 for the resistor R2. If the pins 222 and 232 of the memories 220 and 230 have no ODT therein, the resistors R1 and R2 are damping resistors for damping the reflections from the pins 222 and 232 of the memories 220 and 230 when the controller 210 transmits a signal to the memories 220 and 230. On the contrary, if the pins 222 and 232 of the memories 220 and 230 have ODT therein, the resistors R1 and R2 are connecting resistors with low resistance to electrically connect the trace 260b to the trace 260d and the trace 260c to the trace 260 due to no reflections or reduced reflections from the pins 222 and 232 of the memories 220 and 230. In one embodiment, if the resistors R1 and R2 are connecting components, the resistor R1 may be a trace routed on the PCB 240 since at least one memory is required in an electronic apparatus generally, thus reducing manufacturing costs. It is noted that impedance matching between the signal paths S1 and S2 is necessary. Thus, the resistor R2 is a short-circuit device, such as a 0 ohm resistor, when the resistor R1 is the trace routed on the PCB 240.

Figure 3:
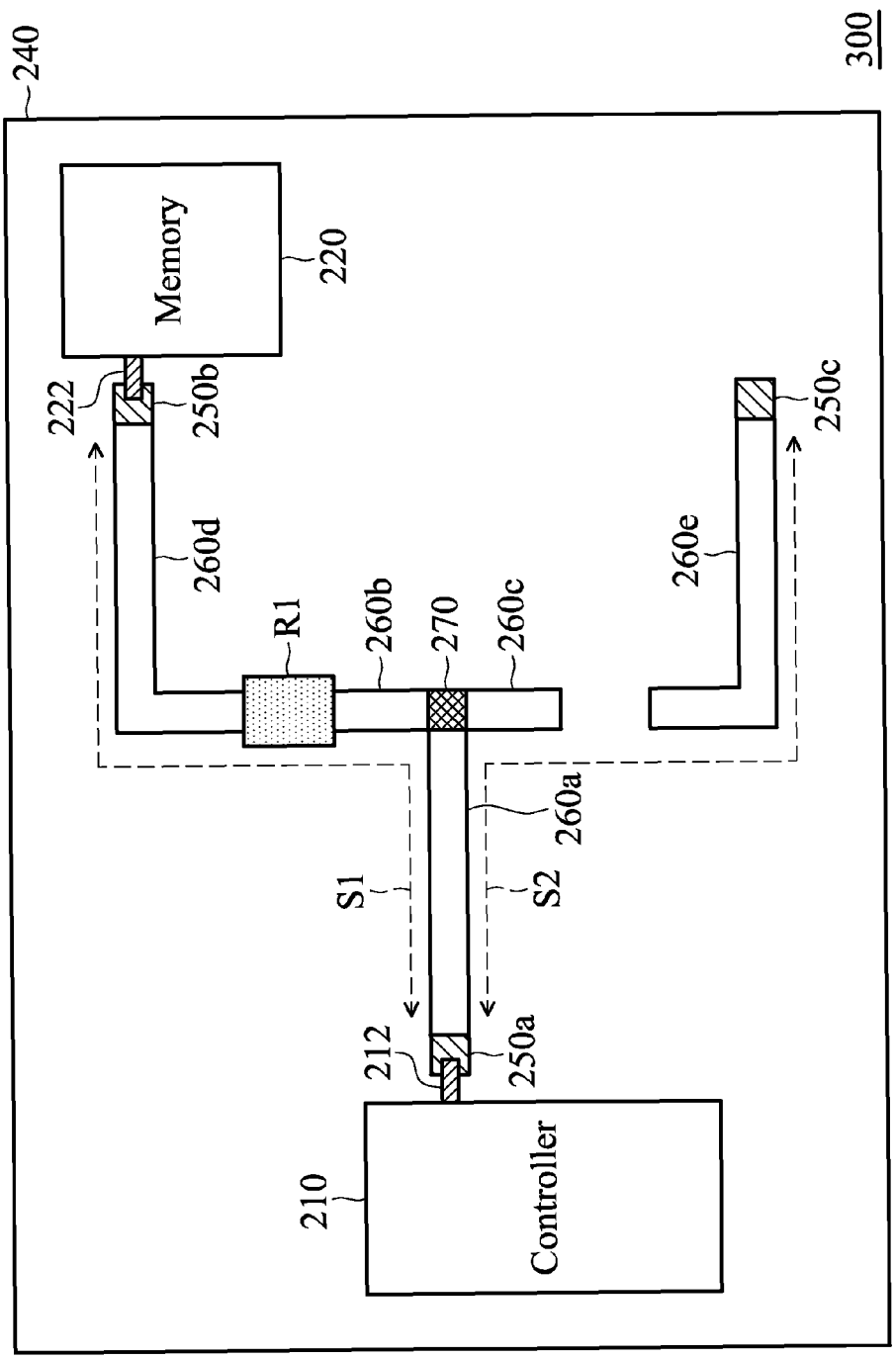
FIG. 3 shows a top view illustrating a PCB within an electronic apparatus according to another embodiment of the invention.

FIG. 3 shows a top view illustrating a PCB 240 within an electronic apparatus 300 according to another embodiment of the invention, wherein only one memory 220 is implemented in the electronic apparatus 300. Referring to FIG. 2 and FIG. 3 together, a manufacturer may use the common PCB 240 for various electronic apparatuses such as the electronic apparatus 200 and 300, wherein the electronic apparatus 200 may be a high-end product and the electronic apparatus 300 may be a low-end product. Compared with the electronic apparatus 200 of FIG. 2, the memory 230 and the resistor R2 are not soldered to the PCB 240 of the electronic apparatus 300 in FIG. 3. Referring to FIG. 3, the traces 260b and 260c are the branches of the trace 260a, which are branched through the branch point 270. Since the memory 230 and the resistor R2 are not soldered to the PCB 240 of the electronic apparatus 300, the trace 260c may serve as a floating stub of the signal path S1 when the controller 210 accesses the memory 220 through the signal path S1. Because the trace 260c is short enough and near to the branch point 270, reflection caused by antenna effect is decreased when the controller 210 accesses the memory 220 through the signal path S1.

Figure 4:
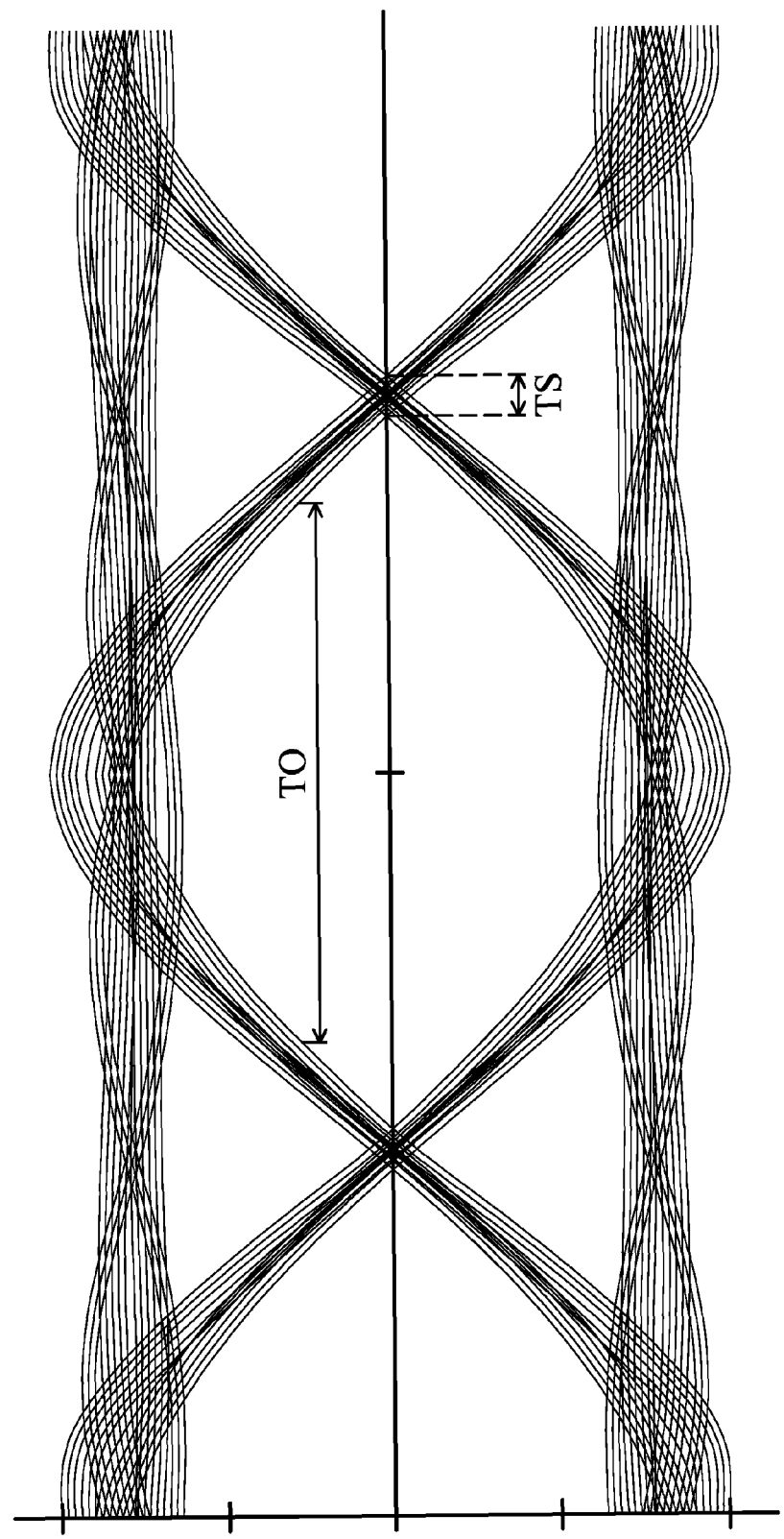
FIG. 4 shows an eye diagram illustrating the signals of the memory accessed by the controller of the electronic apparatus of FIG. 3.

FIG. 4 shows an eye diagram illustrating the signals of the memory 220 accessed by the controller 210 of the electronic apparatus 300 of FIG. 3. Compared to conventional design, a wide eye opening T0 and a small signal skew TS are obtained in the embodiment.

Figure 5:
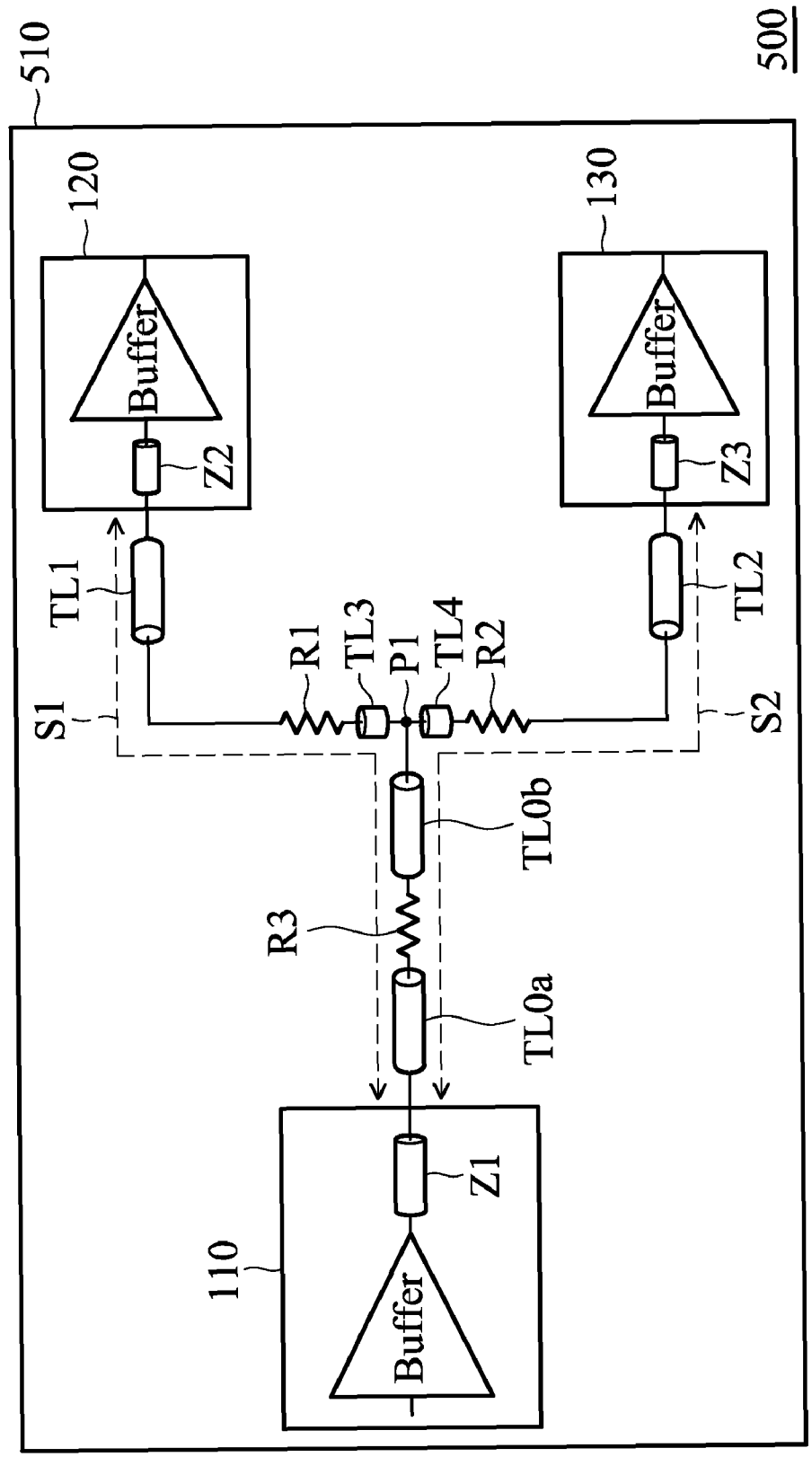
FIG. 5 shows a schematic illustrating an electronic apparatus according to another embodiment of the invention.

FIG. 5 shows a schematic illustrating an electronic apparatus 500 according to another embodiment of the invention, wherein the electronic apparatus 500 has a PCB 510 that is able to supply two memories. Compared to the electronic apparatus 100 of FIG. 1, the electronic apparatus 500 further comprises a resistor R3 disposed in the common segment of the signal paths S1 and S2, i.e. the transmission line TL0 of FIG. 1 is divided into two transmission lines TL0a and TL0b of FIG. 5. In FIG. 5, the I/O blocks 120 and 130 represent the pins of the first and second memories without ODT. Therefore, the resistor R3 is a damping resistor with resistance larger than or equal to a specific resistance value, and the resistors R1 and R2 are connecting resistors with resistance smaller than or equal to the specific resistance value, such as $R1 \leq 10$ ohm, $R2 \leq 10$ ohm and $R3 \geq 10$ ohm. Similarly, the resistors R1 and R2 are disposed near to the branch point P1, i.e. the transmission line TL3 is shorter than or equal to the transmission line TL1 within the signal path S1 and the transmission line TL4 is shorter than or equal to the transmission line TL2 within the signal path S2. In the embodiment, the R3 is disposed on any location between the I/O block 110 and the branch point P1, i.e. the transmission line TL0a may be shorter than, equal to or larger than the transmission line TL0b. In one embodiment, because the resistors R1 and R2 are connecting components, the resistor R1 may be a trace routed on a PCB 510 and the resistor R2 may be a short-circuit device, thus obtaining impedance matching between the signal paths S1 and S2 and reducing manufacturing costs. Further, with adjusting the driving strength of the controller, there is no special requirement for the resistance of the resistors R1, R2 and R3. For example, when implementing the resistor R3 as damping resistors, there is no preference for resistances of the resistor R3 where resistor with resistances of 0 ohm, can be used for the damping resistor R3 with properly adjusting the driving strength of the controller.

Figure 6:
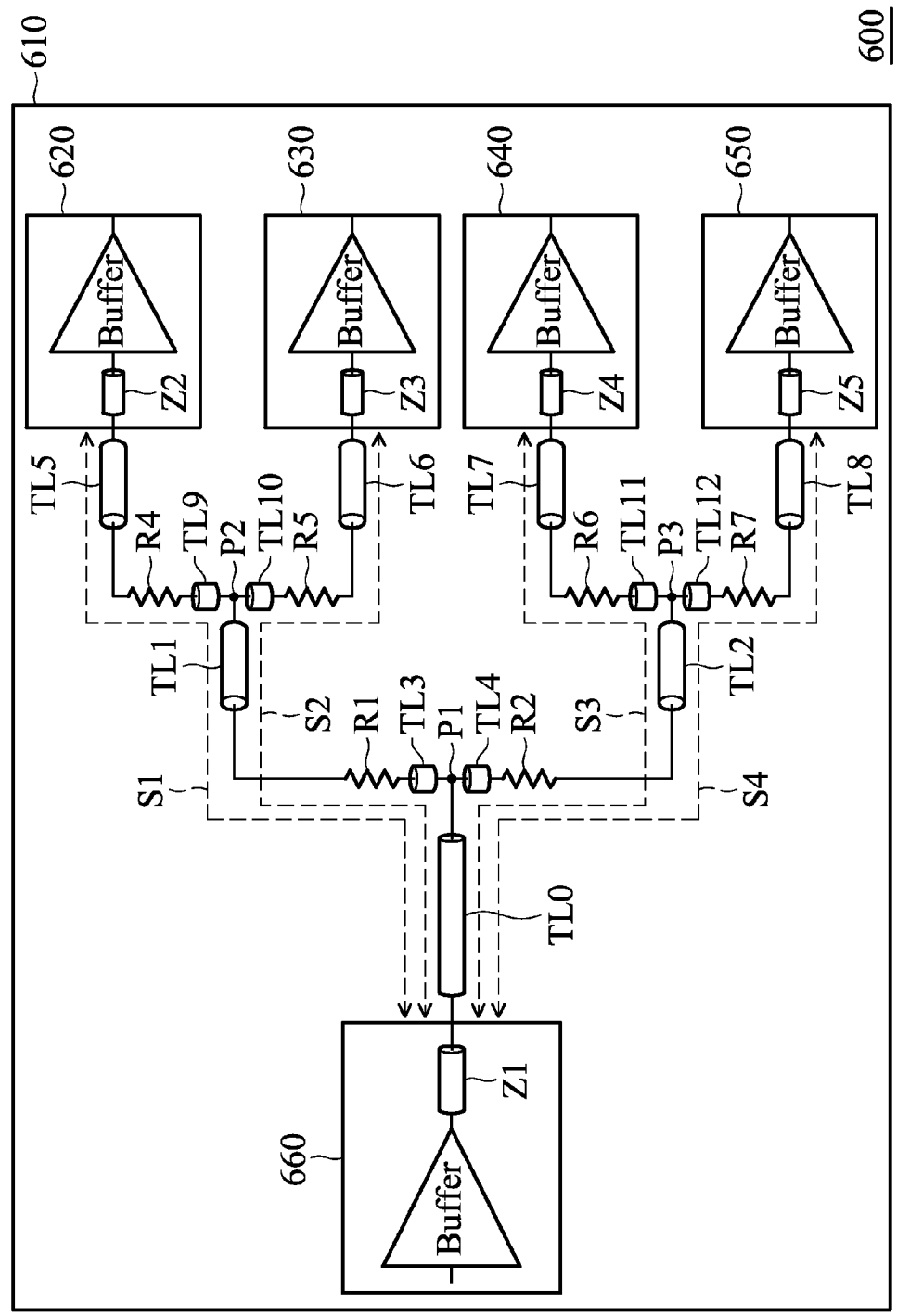
FIG. 6 shows a schematic illustrating an electronic apparatus according to another embodiment of the invention.

FIG. 6 shows a schematic illustrating an electronic apparatus 600 according to another embodiment of the invention, wherein the electronic apparatus 600 has a PCB 610 that is able to supply four memories at most. In the electronic apparatus 600, the I/O block 660 represents one pin of a controller (not shown), which is used to provide a specific signal, such as an address, data, a chip select, and a write enable signal and so on, to four memories (not shown) through the I/O blocks 620, 630, 640 and 650, respectively. The I/O block 620 represents one pin of a first memory corresponding to the specific signal, the I/O block 630 represents one pin of a second memory corresponding to the specific signal, the I/O block 640 represents one pin of a third memory corresponding to the specific signal, the I/O block 650 represents one pin of a fourth memory corresponding to the specific signal. In addition, the inner equivalent impedances of the I/O blocks 660, 620, 630, 640 and 650 are shown as the impedances Z1, Z2, Z3, Z4 and Z5, respectively. In the embodiment, the controller and the four memories are independent chips disposed on a PCB 610. The I/O block 660 of the controller provides the specific signal to the I/O block 620 of the first memory through a transmission line TL0, a transmission line TL3, a resistor R1, a transmission line TL1, a transmission line TL9, a resistor R4, a transmission line TL5 which form a signal path S1. The I/O block 660 of the controller provides the specific signal to the I/O block 630 of the second memory through the transmission line TL0, the transmission line TL3, the resistor R1 and the transmission line TL1, a transmission line TL10, a resistor R5 and the transmission line TL6 which form a signal path S2. The I/O block 660 of the controller provides the specific signal to the I/O block 640 of the third memory through the transmission line TL0, a transmission line TL4, a resistor R2, a transmission line TL2, a transmission line TL11, a resistor R6, a transmission line TL7 which form a signal path S3. The I/O block 660 of the controller provides the specific signal to the I/O block 650 of the fourth memory through the transmission line TL0, the transmission line TL4, the resistor R2 and the transmission line TL2, a transmission line TL12, a resistor R7 and the transmission line TL8 which form a signal path S4.

Therefore, the signals carried in the signal paths S1, S2, S3 and S4 are identical. In addition, the signal paths S1, S2, S3 and S4 have a common segment shared between the I/O block 660 and a branch point P1 on the PCB 610, i.e. the transmission line TL0. Except for the transmission line TL0, the signal paths S1 and S2 have another common segment shared between the branch point P1 and a branch point P2 on the PCB 610, i.e. the transmission line TL3, the resistor R1 and the transmission line TL1. Except for the transmission line TL0, the signal paths S3 and S4 have another common segment shared between the branch point P1 and a branch point P3 on the PCB 610, i.e. the transmission line TL4, the resistor R2 and the transmission line TL2. Furthermore, the resistors R1 and R2 are disposed near to the branch point P1, i.e. the transmission line TL3 is shorter than or equal to the transmission line TL1 within the signal paths S1 and S2 and the transmission line TL4 is shorter than or equal to the transmission line TL2 within the signal paths S3 and S4. The resistors R4 and R5 are disposed near to the branch point P2, i.e. the transmission line TL9 is shorter than or equal to the transmission line TL5 within the signal path S1 and the transmission line TL10 is shorter than or equal to the transmission line TL6 within the signal path S2. Similarly, the resistors R6 and R7 are disposed near to the branch point P3, i.e. the transmission line TL11 is shorter than or equal to the transmission line TL7 within the signal path S3 and the transmission line TL12 is shorter than or equal to the transmission line TL8 within the signal path S4.

In one embodiment, each of the resistors shown in FIG. 6 is a damping resistor with resistance larger than or equal to a specific resistance value if the I/O blocks 620, 630, 640 and 650 represent the pins of the memories without ODT. In another embodiment, the resistors R1 and R2 are connecting resistors with resistance smaller than or equal to the specific resistance value and the resistors R3, R4, R5 and R6 are damping resistors with resistance larger than or equal to the specific resistance value when the I/O blocks 620, 630, 640 and 650 represent the pins of the memories without ODT. In another embodiment, each of the resistors shown in FIG. 6 is a connecting resistor with resistance smaller than or equal to the specific resistance value if the I/O blocks 620, 630, 640 and 650 represent the pins of the memories with ODT. Further, with adjusting the driving strength of the controller, there is no special requirement for the resistance of the resistors shown in FIG. 6. For example, when implementing the resistors R1, R2, R4, R5, R6 and R7 as damping resistors, there is no preference for resistances of the resistors where resistors with resistances of 0 ohm, can be used for the damping resistors R1, R2, R4, R5, R6 and R7 with properly adjusting the driving strength of the controller. Similarly, when implementing the resistors R1, R2, R4, R5, R6 and R7 as connecting resistors, there is no preference for resistances of the resistors where resistors with larger resistances, such as 47 ohm, can be used for the connecting resistors R1, R2, R4, R5, R6 and R7 with properly adjusting the driving strength of the controller.

In FIG. 6, at least one memory and at most four memories may be implemented in the electronic apparatus 600. If a memory is chosen and soldered to the PCB 610, the related resistors located in the signal path corresponding to the chosen memory also need to be soldered to the PCB 610, so as to ensure that a signal between the controller and the chosen memory can be transmitted through the signal path corresponding to the chosen memory. For example, if only the first memory is implemented in the electronic apparatus 600, the resistors R1 and R4 must be soldered to the PCB 610. In other word, the second, third and four memories are removed from the PCB 610 of FIG. 6, along with the resistors disposed in the signal paths corresponding to the removed memories. If the first and second memories are chosen and soldered to the PCB 610, the resistors R1, R4 and R5 located in the signal paths S1 and S2 must be soldered to the PCB 610. If the first and third memories are chosen and soldered to the PCB 610, the resistors R1, R2, R4 and R6 located in the signal paths S1 and S3 must be soldered to the PCB 610.

Figure 7:
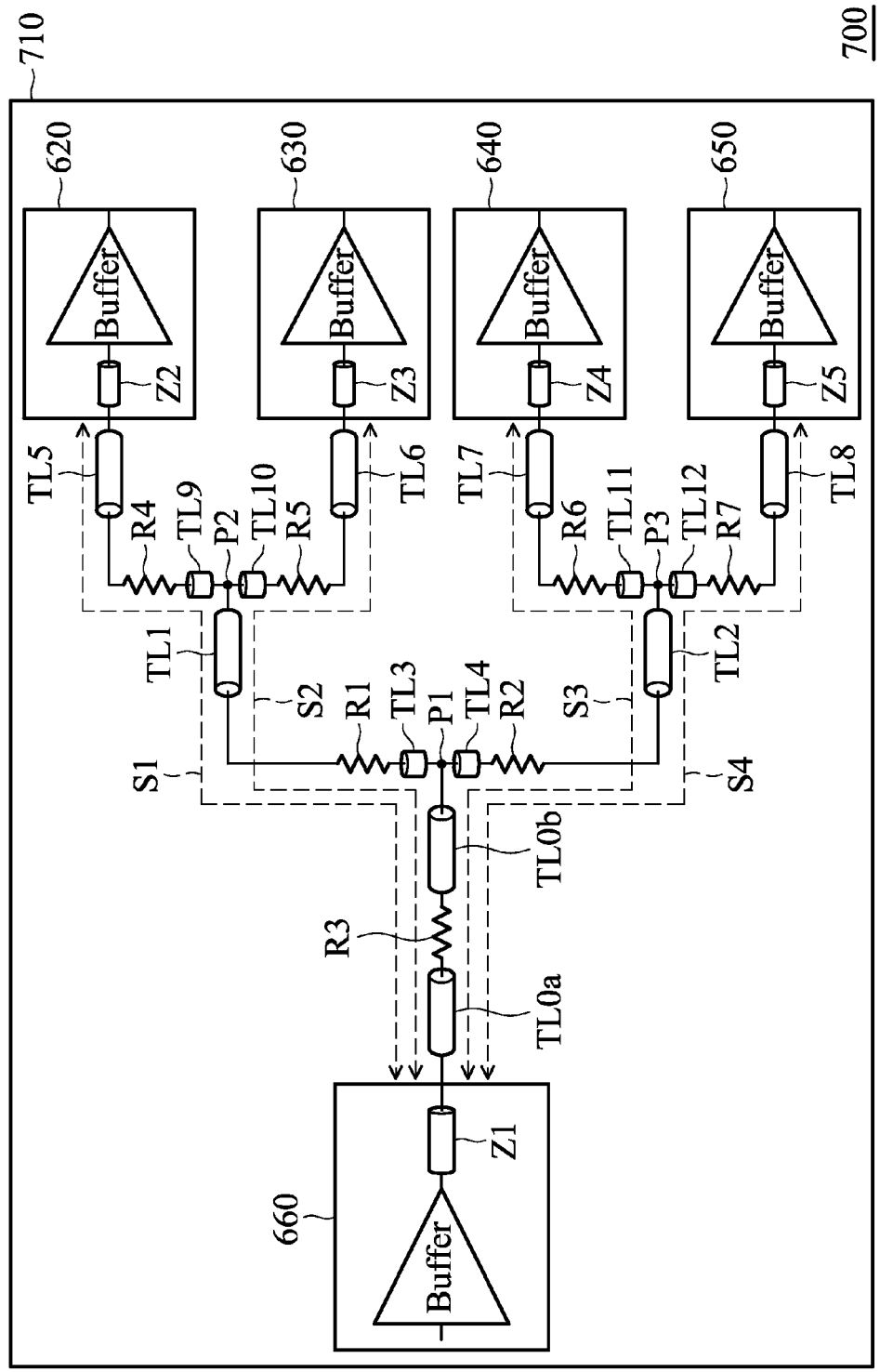
FIG. 7 shows a schematic illustrating an electronic apparatus according to another embodiment of the invention.

FIG. 7 shows a schematic illustrating an electronic apparatus 700 according to another embodiment of the invention, wherein the electronic apparatus 700 has a PCB 710 that is able to supply four memories. Compared to the electronic apparatus 600 of FIG. 6, the electronic apparatus 700 further comprises a resistor R3 disposed in the common segment of the signal paths S1, S2, S3 and S4, i.e. the transmission line TL0 of FIG. 6 is divided into the transmission lines TL0a and TL0b of FIG. 7. In FIG. 7, the I/O blocks 620, 630, 640 and 650 represent the pins of the first, second, third and fourth memories without ODT. Therefore, the resistor R3 is a damping resistor with resistance larger than or equal to a specific resistance value, and the resistors R1, R2, R4-R7 are connecting resistors with the resistance smaller than or equal to the specific resistance value. In the embodiment, the R3 is disposed on any location between the I/O block 660 and the branch point P1, i.e. the transmission line TL0a may be shorter than, equal to or larger than the transmission line TL0b. In one embodiment, due to the resistors other than the resistor R3 being connecting components, the resistors R1 and R4 may be the traces routed on a PCB 710 and the resistor R2 and R5-R7 may be short-circuit devices, thus obtaining impedance matching between the signal paths S1, S2, S3 and S4 and reducing manufacturing costs. Further, when implementing the resistor R3 as damping resistors, there is no preference for resistances of the resistor R3 where resistor with resistances of 0 ohm, can be used for the damping resistor R3 with properly adjusting the driving strength of the controller.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electronic apparatus, comprising:
   a printed circuit board (PCB) with a first signal path and a second signal path therein;
   a first finger disposed on the first signal path;
   a second finger disposed on the second signal path;
   a controller disposed on the PCB and coupled to a first memory via the first finger and to a second memory via the second finger, for accessing the first and second memories through the first and second signal paths, respectively, wherein the first and second signal paths share a common segment between the controller and a branch point on the PCB;
   a first component disposed on the first signal path and between the first finger and the branch point, wherein a distance between the first component and the branch point is smaller than or equal to a distance between the first component and the first finger within the first signal path; and a second component disposed on the second signal path and between the second finger and the branch point, wherein a distance between the second component and the branch point is smaller than or equal to a distance between the second component and the second finger within the second signal path.

2. The electronic apparatus as claimed in claim 1, wherein when one of the first and second memories is not soldered to the PCB, the component disposed on the signal path corresponding to the memory that is not coupled to the controller is removed.

3. The electronic apparatus as claimed in claim 1, wherein when only one of the first and second memories is soldered to the PCB and coupled to the corresponding finger, the component disposed on the signal path corresponding to the soldered memory is a trace.

4. The electronic apparatus as claimed in claim 1, wherein the first and second components are damping devices when each pin of the first and second memories electrically coupled to the first and second fingers respectively is a pin without on-die termination, and the first and second components are connecting devices when each pin of the first and second memories electrically coupled to the first and second fingers respectively is a pin with on-die termination.

5. The electronic apparatus as claimed in claim 1, further comprising:
a damping device disposed on the common segment of the first and second signal paths;
wherein the first and second components are connecting devices and each pin of the first and second memories electrically coupled to the first and second fingers respectively is a pin without on-die termination.

6. An electronic apparatus, comprising:
a printed circuit board (PCB) with a first signal path, a second signal path, a third signal path and a fourth signal path therein;
a first finger disposed on the first signal path;
a second finger disposed on the second signal path;
a third finger disposed on the third signal path;
a fourth finger disposed on the fourth signal path;
a controller disposed on the PCB and coupled to a first memory via the first finger, a second memory via the second finger, a third memory via the third finger, and a fourth memory via the fourth finger, for accessing the first, second, third and fourth memories through the first, second, third and fourth signal paths, respectively, wherein the first, second, third and fourth signal paths have a first common segment shared between the controller and a first branch point on the PCB, the first and second signal paths have a second common segment shared between the first branch point and a second branch point on the PCB, and the third and fourth signal paths have a third common segment shared between the first branch point and a third branch point on the PCB;
a first component on the PCB, disposed on the second common segment, wherein a distance between the first component and the first branch point is smaller than or equal to a distance between the first component and the second branch point within the second common segment of the first and second signal paths;
a second component on the PCB, disposed on the third common segment, wherein a distance between the second component and the first branch point is smaller than or equal to a distance between the second component and the third branch point within the third common segment of the third and fourth signal paths;
a third component on the PCB, disposed on a segment of the first signal path between the first finger and the second branch point, wherein a distance between the third component and the second branch point is smaller than or equal to a distance between the third component and the first finger within the first signal path;
a fourth component on the PCB, disposed on a segment of the second signal path between the second finger and the second branch point, wherein a distance between the fourth component and the second branch point is smaller than or equal to a distance between the fourth component and the second finger within the second signal path;
a fifth component on the PCB, disposed on a segment of the third signal path between the third finger and the third branch point, wherein a distance between the fifth component and the third branch point is smaller than or equal to a distance between the fifth component and the third finger within the third signal path; and
a sixth component on the PCB, disposed on a segment of the fourth signal path between the fourth finger and the third branch point, wherein a distance between the sixth component and the third branch point is smaller than or equal to a distance between the sixth component and the fourth finger within the fourth signal path.

7. The electronic apparatus as claimed in claim 6, wherein when the second, third and fourth memories are not soldered to the PCB, the second, fourth, fifth and sixth components are removed.

8. The electronic apparatus as claimed in claim 6, wherein when the third and fourth memories is not soldered to the PCB, the components disposed in the third and fourth signal paths are removed.

9. The electronic apparatus as claimed in claim 6, wherein the components are damping devices when each pin of the memories electrically coupled to the signal paths is a pin without on-die termination.

10. The electronic apparatus as claimed in claim 6, wherein the first and second components are connecting devices and the third, fourth, fifth and sixth components are damping devices when each pin of the memories electrically coupled to the signal paths is a pin without on-die termination.

11. The electronic apparatus as claimed in claim 6, wherein the components are connecting devices when each pin of the memories electrically coupled to the signal paths is a pin with on-die termination.

12. The electronic apparatus as claimed in claim 6, further comprising:
a damping device on the PCB, disposed on the first common segment of the first, second, third and fourth signal paths,
wherein the components are connecting devices, and each pin of the memories electrically coupled to the signal paths is a pin without on-die termination.

13. An electronic apparatus, comprising:
a printed circuit board (PCB), comprising:
a substrate having a surface;
a plurality of fingers on the surface of the substrate;
a first conductive trace on the surface of the substrate, wherein the first conductive trace is disposed between a first finger of the plurality of fingers and a branch via of the substrate;
a second conductive trace on the surface of the substrate, wherein the second conductive trace is disposed between a second finger of the plurality of fingers and the branch via of the substrate; and a third conductive trace on the surface of the substrate, wherein the first, second and third conductive traces are electrically crossed in the branch via of the substrate;

a controller on the PCB, having a pin electrically coupled to the first conductive trace of the PCB through the first finger of the PCB;

a first memory on the PCB, having a pin electrically coupled to the second conductive trace of the PCB through the second finger of the PCB; and a first component on the surface of the substrate, dividing a second conductive trace into a first sub-trace between the first component and the branch via and a second sub-trace between the first component and the second finger, and the first sub-trace is shorter than or equal to the second sub-trace, wherein a length of the third conductive trace is substantially similar to that of the first sub-trace of the second conductive trace.

14. The electronic apparatus as claimed in claim 13, further comprising:

a second memory on the PCB, having a pin electrically coupled to a fourth conductive trace on the surface of the substrate through a third finger of the plurality of fingers; and a second component on the surface of the substrate, wherein the second component is disposed between the third and fourth conductive traces such that the third conductive trace is electrically coupled to the fourth conductive trace through the second component, wherein the third conductive trace is shorter than or equal to the fourth conductive trace.

15. The electronic apparatus as claimed in claim 14, wherein the first and second components are damping devices when each of the pins of the first and second memories is a pin without on-die termination.

16. The electronic apparatus as claimed in claim 14, wherein the first and second components are connecting devices when each of the pins of the first and second memories is a pin with on-die termination.

17. The electronic apparatus as claimed in claim 16, wherein the first component is a segment of the second conductive trace of the PCB, and the second component is a short-circuit device with resistance substantially equal to zero.

18. The electronic apparatus as claimed in claim 14, further comprising:

a damping device on the surface of the substrate, wherein the first conductive trace is divided into a first sub-trace and a second sub-trace by the damping device, wherein the first and second components are connecting devices, and each of the pins of the first and second memories is a pin without on-die termination.

19. The electronic apparatus as claimed in claim 18, wherein the first component is a segment of the second conductive trace of the PCB, and the second component is a short-circuit device with resistance substantially equal to zero.

20. The electronic apparatus as claimed in claim 1, wherein resistances of the first and second components are the same, and impedances of the first and second signal paths match.

* * * * *